United States Patent
Chen et al.

(10) Patent No.: US 8,653,648 B2
(45) Date of Patent: Feb. 18, 2014

(54) ZIGZAG PATTERN FOR TSV COPPER ADHESION

(75) Inventors: Chih-Hua Chen, Jhubei (TW); Chen-Shien Chen, Zhubei (TW); Chen-Cheng Kuo, Chu-Pei (TW); Wen-Wei Shen, Xinzhuang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 425 days.

(21) Appl. No.: 12/245,505

(22) Filed: Oct. 3, 2008

(65) Prior Publication Data

US 2010/0084747 A1   Apr. 8, 2010

(51) Int. Cl.
*H01L 23/04* (2006.01)

(52) U.S. Cl.
USPC ........... 257/698; 257/774; 257/776; 257/777; 257/E23.011; 257/E23.145; 257/E23.174; 257/E23.067

(58) Field of Classification Search
USPC ......... 257/698, 700, 750, 751, 753, 758, 774, 257/786, E23.011, E23.067, E23.174, 621, 257/739, 776, 777, 781, E23.02, E23.022, 257/E23.145
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,100,589 A * | 8/2000 | Tanaka | 257/758 |
| 6,184,060 B1 | 2/2001 | Siniaguine | |
| 6,313,540 B1 * | 11/2001 | Kida et al. | 257/784 |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,642,081 B1 * | 11/2003 | Patti | 438/109 |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,909,188 B2 | 6/2005 | Akiyama | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |

(Continued)

FOREIGN PATENT DOCUMENTS

CN   1630051 A   6/2005

*Primary Examiner* — Benjamin Sandvik
*Assistant Examiner* — Leslie Pilar Cruz
(74) *Attorney, Agent, or Firm* — Slater & Matsil, L.L.P.

(57) ABSTRACT

A system and method for forming a TSV contact is presented. A preferred embodiment includes a TSV in contact with a portion of the uppermost metal layer of a semiconductor die. The interface between the TSV conductor and the contact pad is preferably characterized by a non-planar zigzag pattern that forms a grid pattern of contacts. Alternatively, the contacts may form a plurality of metal lines that make contact with the contact pad.

18 Claims, 13 Drawing Sheets

(56) References Cited

U.S. PATENT DOCUMENTS

| | | |
|---|---|---|
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2004/0135267 A1* | 7/2004 | Akiyama ............... 257/784 |
| 2005/0146041 A1* | 7/2005 | Watanabe et al. ........ 257/758 |
| 2005/0179120 A1 | 8/2005 | Yamaguchi |
| 2006/0027928 A1* | 2/2006 | Funakoshi et al. ....... 257/758 |
| 2007/0190692 A1* | 8/2007 | Erturk et al. ............ 438/118 |
| 2009/0008790 A1* | 1/2009 | Lee et al. ............... 257/774 |
| 2009/0045487 A1* | 2/2009 | Jung .................... 257/621 |

* cited by examiner

ZIGZAG PATTERN FOR TSV COPPER ADHESION

TECHNICAL FIELD

The present invention relates generally to a system and method for forming semiconductor devices and, more particularly, to a system and method for forming contacts between a through silicon via (TSV) and metal layers.

BACKGROUND

Generally, to form a contact between the metal layers of a semiconductor die and a TSV extending through the semiconductor die, a passivation layer overlying the metal layer is etched to form a contact opening and expose a contact portion of the metal line. Subsequent to the etch, a barrier layer is formed to contact the exposed contact portion and cover the sidewalls of both the contact opening and the TSV. The contact opening and the TSV are then subsequently overfilled with copper through a process such as electroplating. While a portion of the copper and barrier layer may be removed, a portion of the barrier layer and copper between the contact opening and the TSV is left in order to maintain an electrical contact, thereby establishing electrical contact to the opposite side of the semiconductor die.

However, this process generally results in a copper conductor that has a low adhesion to the underlying material. Further, because the expanding and contracting caused by process heating and cooling can exacerbate this problem of low adhesion, this also may limit the thermal budgets of later processes that may be needed to finish the manufacturing of the semiconductor die. Such a restriction on subsequent process conditions is undesirable.

Therefore, what is needed is a structure and method by which the TSV temperature capability can be increased by increasing the adhesive capability of the conductor.

SUMMARY OF THE INVENTION

These and other problems are generally solved or circumvented, and technical advantages are generally achieved, by preferred embodiments of the present invention which provide for a contact pad with a cross-sectional zigzag shape for better adhesion of the conductor.

In accordance with a preferred embodiment of the present invention, a semiconductor device comprises a substrate with a first conductive feature and a passivation layer over the first conductive feature. A contact pad extends through multiple openings in the passivation layer to make multiple, discontinuous contacts with the first conductive feature.

In accordance with another preferred embodiment of the present invention, a semiconductor device comprises a substrate, metal layers over the substrate, and a passivation layer over the metal layers. A first conductor extends through the passivation layer and shares an interface with the uppermost metal layer. The first conductor alternates between contacting the uppermost metal layer, the passivation layer, and back to the uppermost metal layer. A through silicon via is in contact with the first conductor.

In accordance with yet another preferred embodiment of the present invention, a semiconductor device comprises a substrate with a plurality of metal layers. A first conductor is shaped in a zigzag pattern so as to make multiple contact points with at least one of the metal layers, and a passivation layer is located between the first conductor and the metal layer where the conductor does not contact the metal layer. A second conductor extends from the first conductor into a through silicon via.

An advantage of a preferred embodiment of the present invention is to allow a better adhesion between the contact pad and the conductor. This also allows for more process flexibility, as the temperature range of downstream processes can be expanded to accommodate the better adhesion.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a contact pad between a metal layer and a TSV. The invention may also be applied, however, to other contact pads.

Figure 1:
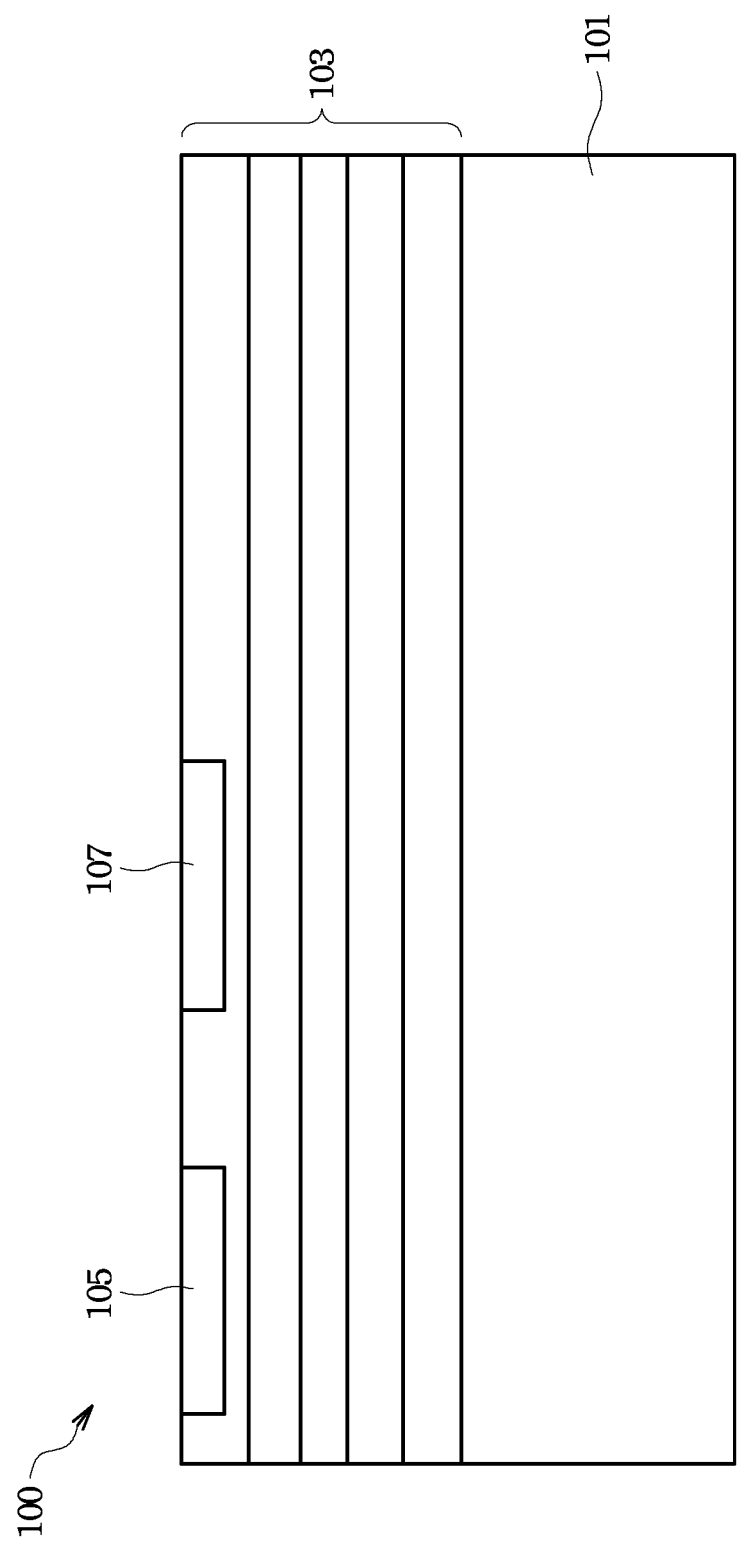
FIG. 1 illustrates a substrate with metallization layers along with upper metal contacts in accordance with an embodiment of the present invention.

With reference now to FIG. 1, there is shown a cross-sectional view of a semiconductor die 100 comprising a substrate 101, metallization layers 103, a first upper metal contact 105, and a second upper metal contact 107. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Various active devices (not shown) such as transistors, capacitors, resistors, and the like may be formed using any suitable methods either within or else on the surface of the substrate 101.

The metallization layers 103 are formed over the substrate 101 and are designed to connect the various active devices to form functional circuitry. The metallization layers 103 are preferably formed of alternating layers of dielectric and conductive material and may be formed through any suitable process (such as deposition, dual damascene, etc.). Preferably, there are at least four layers of metallization separated from the substrate 101 by at least one interlayer dielectric layer (ILD), but the precise number of metallization layers 103 is dependent upon the design of the semiconductor die 100.

The first upper metal contact 105 is preferably located in the uppermost level of the metallization layers 103. The first upper metal contact 105 serves as the contact between the rest of the metallization layers 103 and an exterior contact pad (described below with reference to FIG. 3A). The first upper metal contact 105 preferably comprises a material such as copper and is preferably formed using a damascene or dual damascene process, where copper is overfilled into an opening in a dielectric layer, and then the excess copper is removed through a process such as chemical mechanical polishing (CMP). However, any suitable material (such as aluminum) and any suitable process (such as deposition and etching) may alternatively be used to form the first upper metal contact 105.

The second upper metal contact 107 is also located in the uppermost level of the metallization layers 103, but is separated from the first upper metal contact 105. The second upper metal contact 107 serves as the contact between the rest of the metallization layers 103 and a TSV contact pad (described below with reference to FIG. 3A). The second upper metal contact 107 is formed in a similar fashion and from similar materials as the other metallization layers 103 (e.g., dual damascene or the like).

Figure 2:
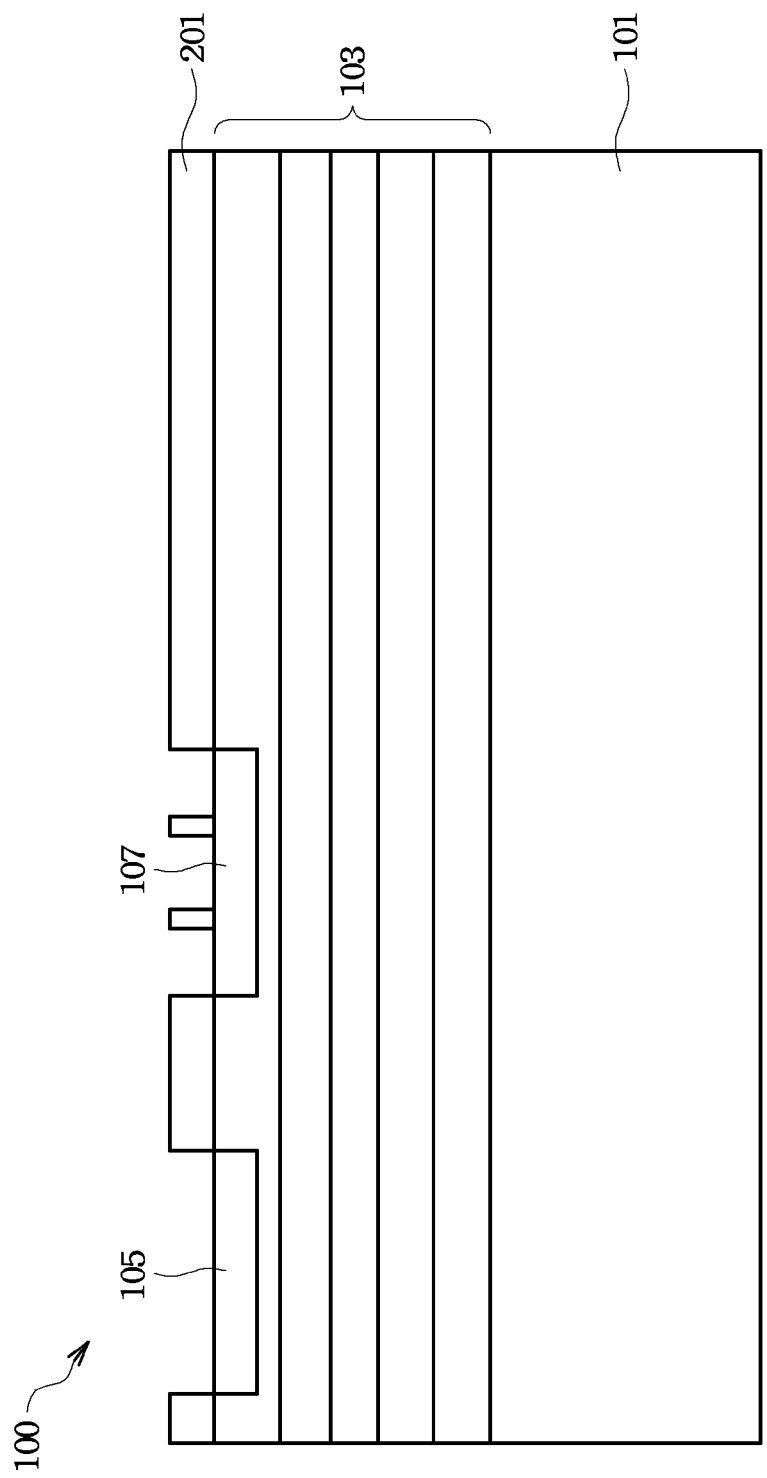
FIG. 2 illustrates the formation of a first passivation layer over a metallization layer and upper metal contacts to form a zigzag pattern in accordance with an embodiment of the present invention.

FIG. 2 illustrates the formation and patterning of a first passivation layer 201 over the metallization layers 103, the first upper metal contact 105, and the second upper metal contact 107. The first passivation layer 201 preferably comprises a dielectric material such as an oxide or silicon nitride, although other suitable dielectrics, such as a high-k dielectric, may alternatively be used. The first passivation layer 201 is preferably formed using a plasma enhanced chemical vapor deposition (PECVD) process, although any other suitable process may alternatively be used. The first passivation layer 201 preferably has a thickness of between about 0.6 μm and about 1.4 μm, with a preferred thickness of about 1 μm.

Once formed, the first passivation layer 201 is preferably patterned using a suitable photolithographic technique. The patterning of the first passivation layer 201 is preferably performed by applying a photosensitive material (not shown), and exposing the photosensitive material to a light in the shape of the desired pattern. The photosensitive material is then preferably developed and undesired portions of the photoresist are then removed, leaving behind a photomask. The pattern of the photomask is then transferred to the first passivation layer 201 through an etching process.

The first passivation layer 201 is preferably patterned to expose a portion of the first upper metal contact 105 and the second upper metal contact 107. The first passivation layer 201 is preferably patterned over the second upper metal contact 107 so as to leave portions of the first passivation layer 201 between exposed portions of the second upper metal contact 107. In this manner the upper surface alternates between the second upper metal contact 107 and the first passivation layer 201, thereby forming a zigzag pattern in the upper surface. The patterning is preferably performed to expose between about 30% and about 70% of the second upper metal contact 107, with about 40% of the second upper metal contact 107 being more preferably exposed. A preferred height of the first passivation layer 201 is between about 1.2 μm and about 3 μm, with a preferred height of about 1.2 μm.

This patterning (to leave portions of the first passivation layer 201 over the second upper metal contact 107) increases the contact surface area of the next layer to be formed over the second upper metal contact 107 and the first passivation layer 201. This increase of the contact surface area helps to improve the adhesion between adjacent layers. Further, by patterning the first passivation layer 201, no additional process steps are required, thereby giving a benefit without a substantial process cost.

Figure 3A:
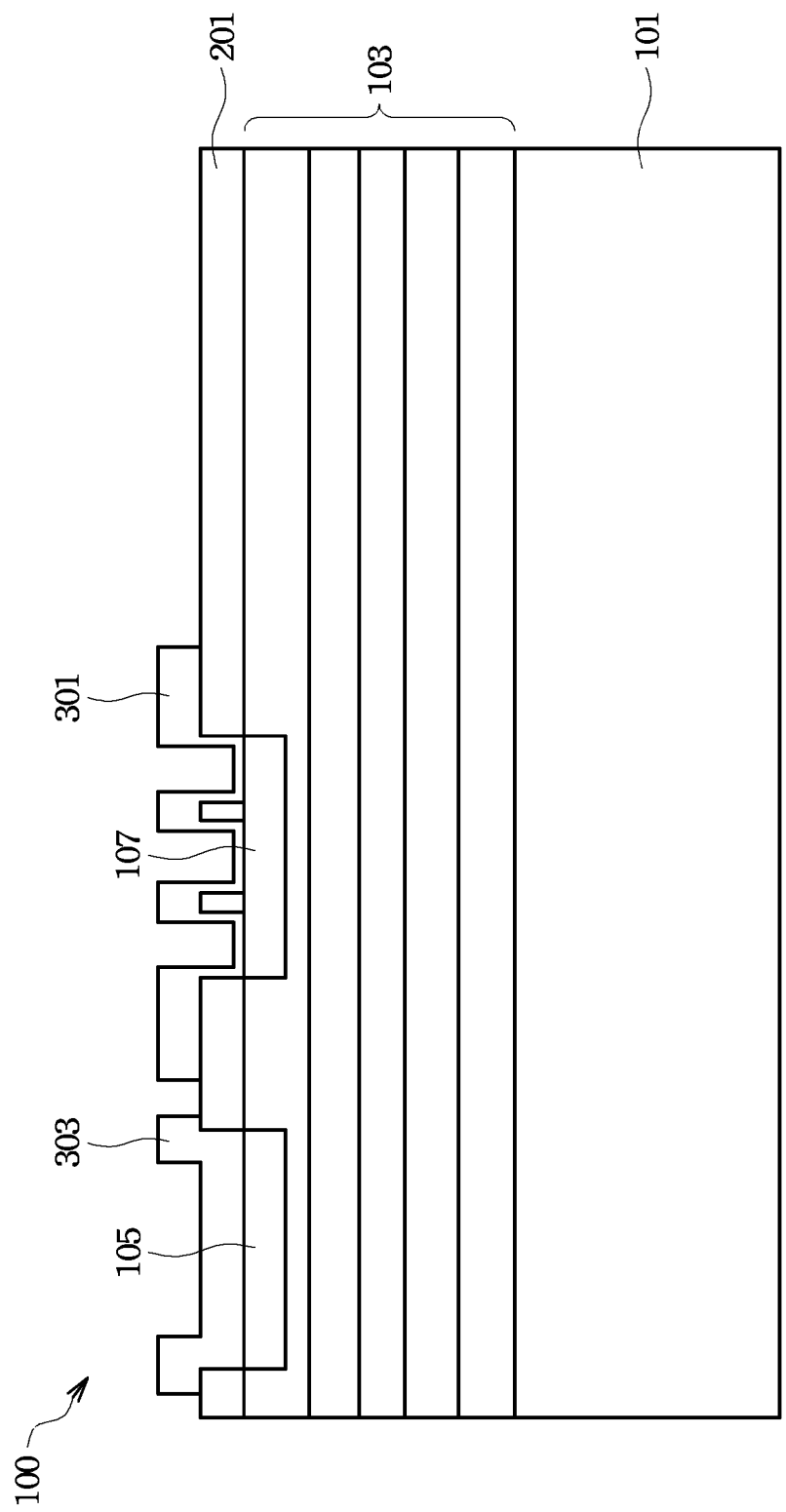
FIGS. 3A-3D illustrate the formation of a TSV contact pad and an exterior contact pad in accordance with an embodiment of the present invention.

FIG. 3A illustrates the formation of a TSV contact pad 301 and an exterior contact pad 303. The TSV contact pad 301 provides a connection from the circuitry of the die 100 (including the active devices and the metallization layers) to a later formed TSV (described below with respect to FIGS. 5-11). The exterior contact pad 303 serves as a connection from the semiconductor die 100 to other devices (not shown) off the semiconductor die 100. The exterior contact pad 303 is preferably connected to a wire bond (not shown), although any suitable type of connection, such as a ball grid array or compression type of connection, may alternatively be connected to the exterior contact pad 303.

The TSV contact pad 301 and exterior contact pad 303 preferably comprise aluminum, and are preferably formed by conformally depositing a layer of aluminum over the first passivation layer 201. This conformal deposition fills those portions of the first passivation layer 201 that were removed, and retains the zigzag pattern formed by the first passivation layer 201 and the second upper metal contact 107. Once the layer of aluminum has been deposited, a photoresist is then preferably formed over the layer, and the layer of aluminum is then etched to form the TSV contact pad 301 and the exterior contact pad 303.

However, as one of skill in the art will realize, the above described process for forming the TSV contact pad 301 and the exterior contact pad 303 is merely one material and method of formation. Other suitable materials may be utilized, including (but not limited to): aluminum, gold, silver, nickel, copper, tungsten, titanium, tantalum, compounds thereof, alloys thereof, multiple layers thereof, composites thereof, and combinations thereof, for example. Further, different materials may require different methods of formation, such as sputtering or even a dual damascene process. All of these materials and methods of formation may alternatively be used, and each is fully intended to be included within the scope of the present invention.

Figure 3B:
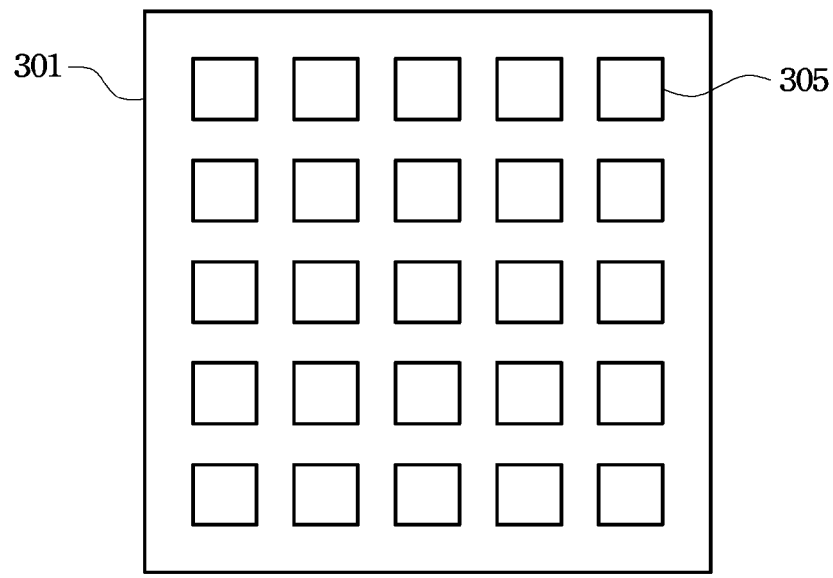
Figure 3C:
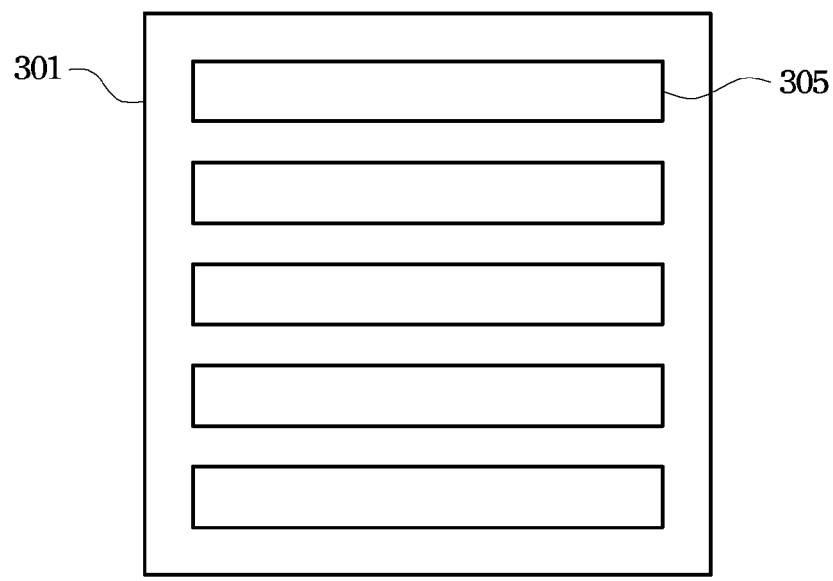
Figure 3D:
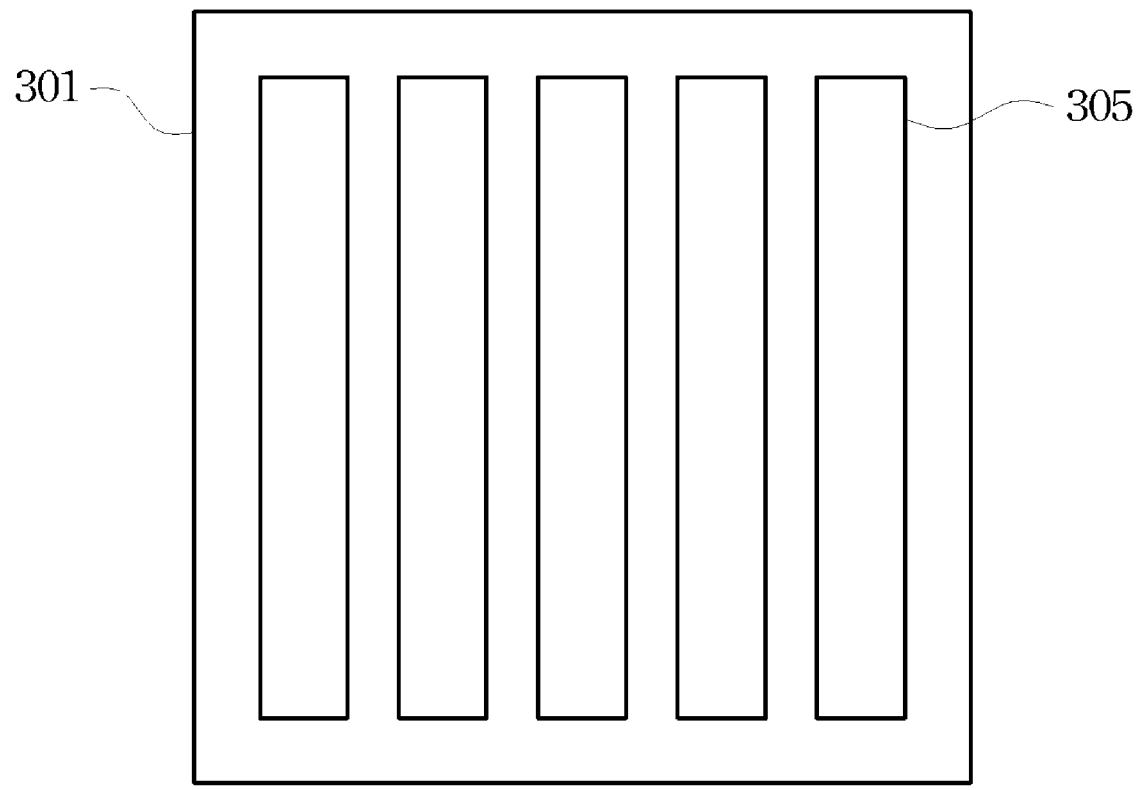

FIGS. 3B-3D illustrate a plan view of the TSV contact pad 301 and illustrate raised portions 305 of the TSV contact pad 301 that preferably have the same shape of the underlying first passivation layer 201. These raised portions 305 of the TSV contact pad 301 are preferably formed as substantially square plateaus as illustrated in FIG. 3B. However, the raised portions 305 of the TSV contact pad 301 may alternatively be formed as raised metal lines in either a first direction, as illustrated in FIG. 3C, or in a second direction, as illustrated in FIG. 3D, although these will take up a larger area of the TSV contact pad 301.

Figure 4:
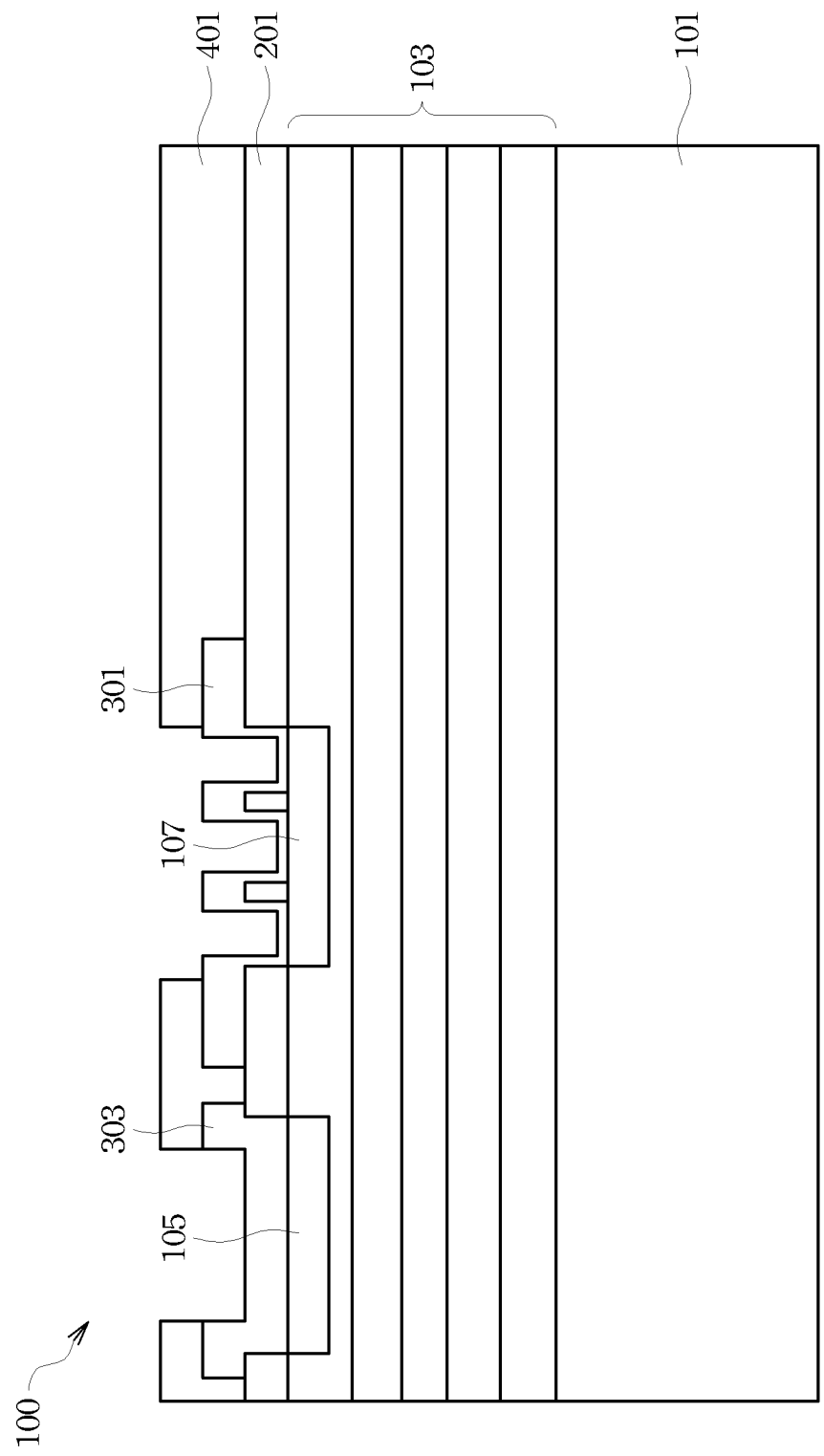
FIG. 4 illustrates the formation of a second passivation layer in accordance with an embodiment of the present invention.

FIG. 4 illustrates the formation of a second passivation layer 401 over the first passivation layer 201, the exterior contact pad 303 and the TSV contact pad 301. The second passivation layer 401 preferably comprises a dielectric material such as an oxide or silicon nitride, although other suitable dielectrics may alternatively be used. The second passivation layer 401 is preferably formed using a plasma enhanced chemical vapor deposition (PECVD) process, although any suitable process, such as CVD or LPCVD, may alternatively be used. The second passivation layer 401 preferably has a thickness of between about 0.6 µm and about 1.4 µm, with a preferred thickness of about 1 µm.

After the second passivation layer 401 has been formed, the second passivation layer 401 is patterned so as to expose portions of the TSV contact pad 301 and the exterior contact pad 303. The patterning is preferably performed by applying and developing a photolithographic film (not shown) over the second passivation layer 401 and then removing the undeveloped, non-desired portions to form a photomask. Once the photomask is in place, the second passivation layer 401 is then etched using the photomask as a mask to transfer the pattern to the second passivation layer 401.

Figure 5:
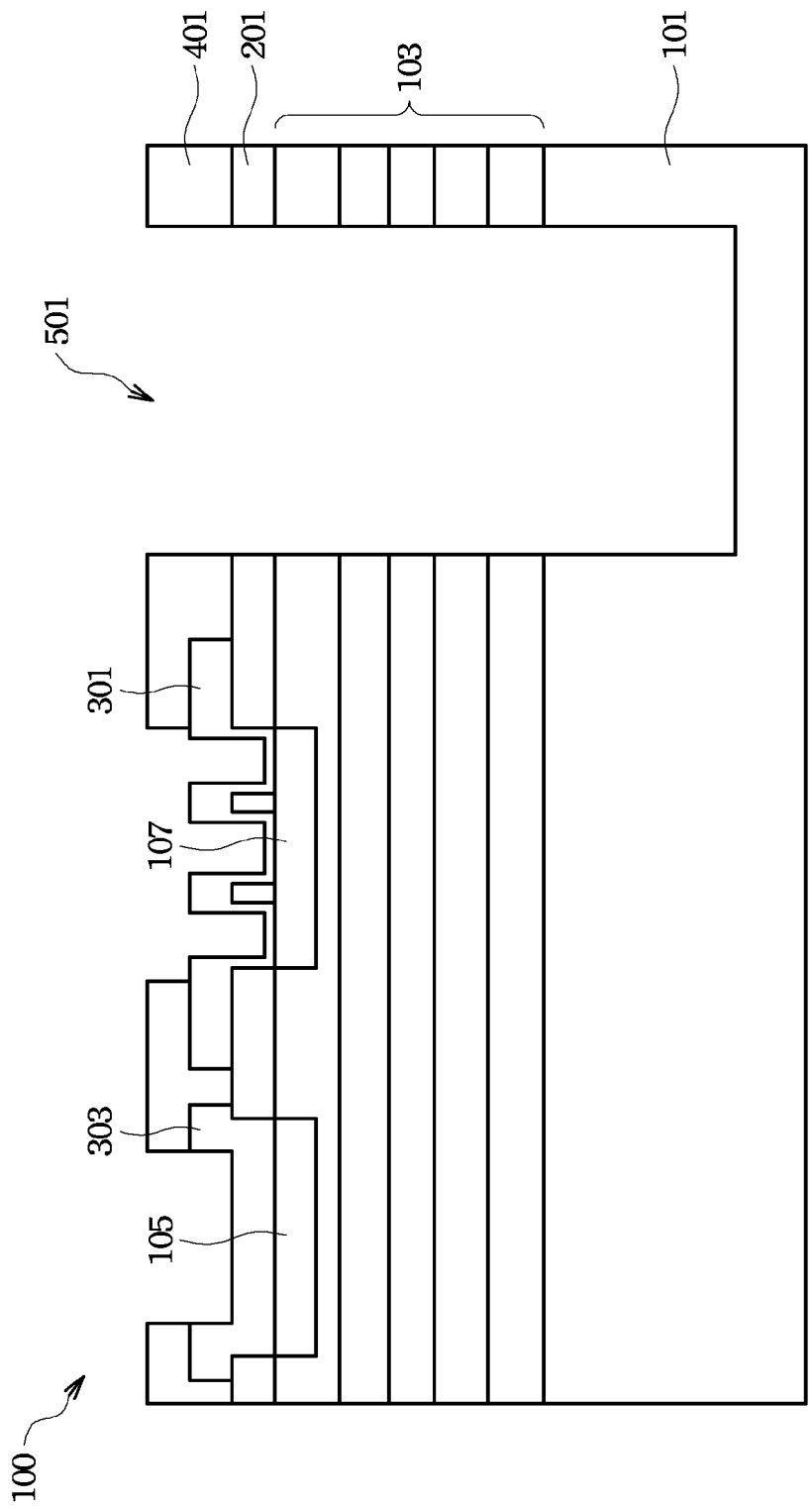
FIG. 5 illustrates the formation of a TSV opening in accordance with an embodiment of the present invention.

FIG. 5 illustrates the formation of a TSV opening 501. The TSV opening 501 is preferably formed by applying and developing a suitable photoresist (not shown), and then etching the second passivation layer 401, the first passivation layer 201, the metallization layers 103, and at least a portion of the substrate 101. Alternatively, the TSV opening 501 may be formed concurrently with the formation of the individual layers (e.g., dielectric and metal layers) as the semiconductor die 100 is being built upwards from the substrate 101.

Preferably, the TSV opening 501 is formed so as to extend into the substrate 101 at least further than the electrical devices formed within and on the substrate 101, and preferably at least to a depth greater than the eventual desired height of the die 100. Accordingly, while the depth of the TSV opening 501 from the surface of the substrate 101 is dependent upon the overall design of the semiconductor die 100, the depth is preferably between about 70 µm and about 190 µm, with a preferred depth of about 150 µm. Further, the TSV opening 501 preferably has a diameter of between about 20 µm and about 70 µm, with a preferred diameter of about 50 µm.

Figure 6:
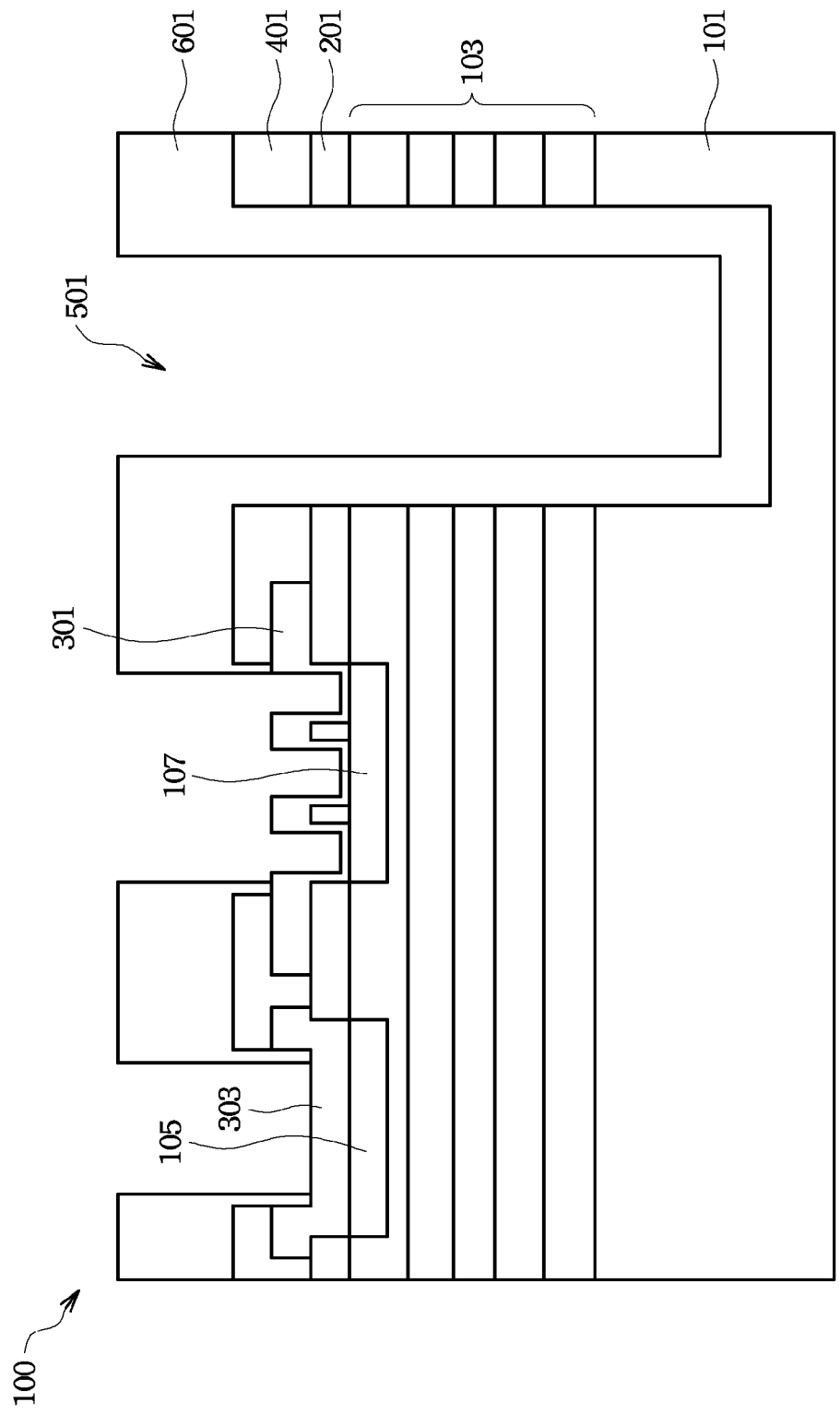
FIG. 6 illustrates the formation of an isolation layer over a die in accordance with an embodiment of the present invention.

FIG. 6 illustrates the formation and patterning of an isolation layer 601 over the semiconductor die 100, the isolation layer 601 covering the sidewalls and bottom of the TSV opening 501. The isolation layer 601 is preferably either tetraethylorthosilicate (TEOS) or silicon nitride, although any suitable dielectric may alternatively be used. The isolation layer 601 is preferably formed using a plasma enhanced chemical vapor deposition (PECVD) process, although other suitable processes may alternatively be used.

Once the isolation layer 601 has been deposited, it is patterned by forming a photoresist layer (not shown) over the isolation layer 601. Once the photoresist layer has been formed over the isolation layer 601, the photoresist layer is patterned by exposing it to light, developing the photoresist, and then removing the unexposed portions. Preferably, the photoresist layer is patterned so as to expose a portion of the isolation layer 601 for subsequent etching.

After the photoresist layer has been patterned, exposed portions of the isolation layer 601 are etched. This etch is preferably performed using a fluorine based etchant such as $CF_4$, $CHF_3$, or $SF_6$, although any suitable etchant may alternatively be used. The etch is preferably continued until portions of the exterior contact pad 303 and portions of the TSV contact pad 301 are exposed. Once the etching has been completed, the patterned photoresist layer is preferably removed by a suitable ashing or stripping process.

Figure 7:
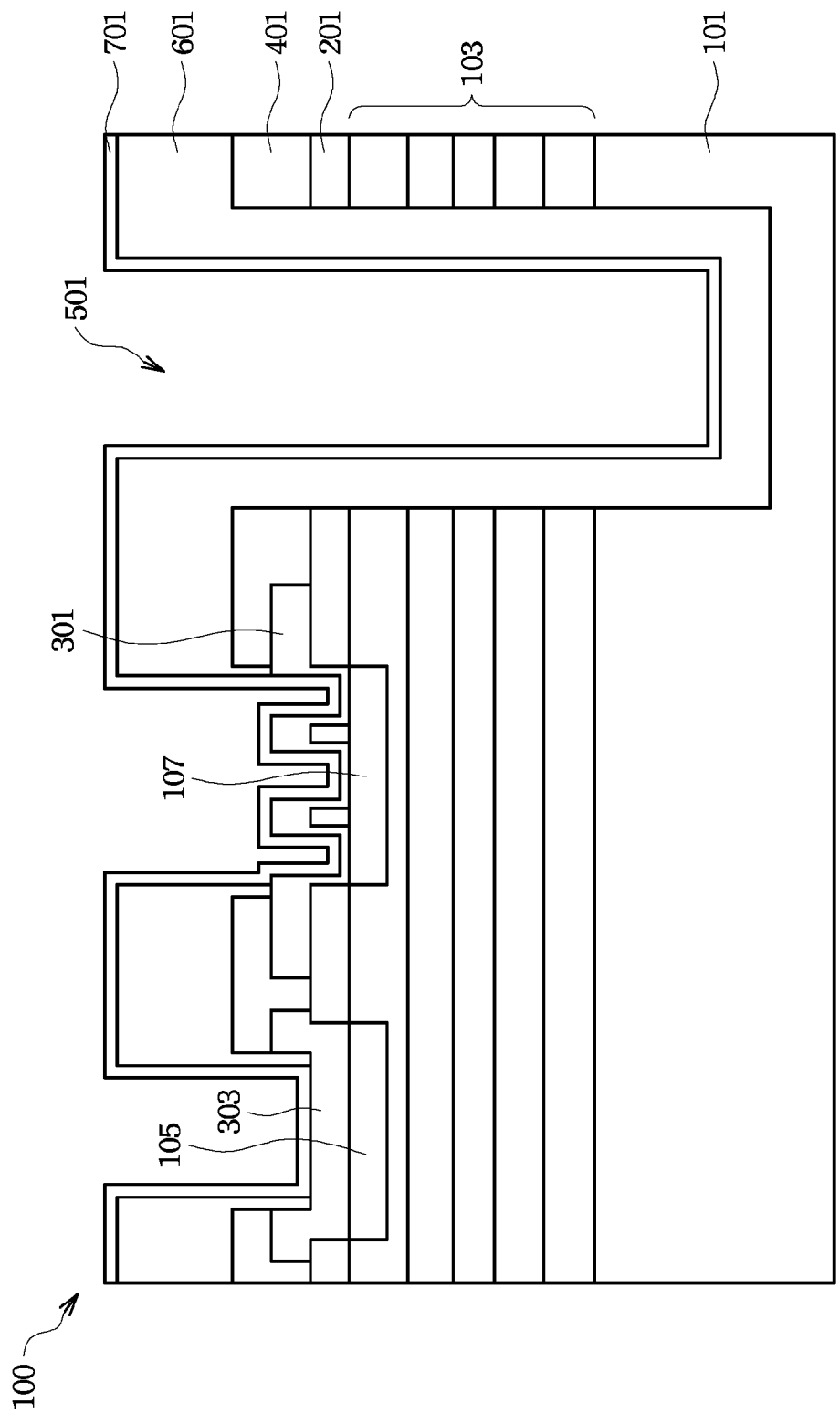
FIG. 7 illustrates the formation of a barrier layer over a TSV contact pad and a TSV opening in accordance with an embodiment of the present invention.

FIG. 7 illustrates the formation of a barrier layer 701 over the remainder of the isolation layer 601, and in contact with the exterior contact pad 303 and the TSV contact pad 301. The barrier layer 701 preferably comprises a conductive material such as titanium nitride, although other materials, such as tantalum nitride or titanium, may alternatively be utilized. The barrier layer 701 is preferably formed using a CVD process, such as PECVD. However, other alternative processes, such as sputtering or metal organic chemical vapor deposition (MOCVD), may alternatively be used. The barrier layer 701 is formed so as to contour to the underlying shape of the semiconductor die 100. Preferably, a portion of the barrier layer 701 conforms to the shape of the remainder of the isolation layer 601, thereby maintaining the zigzag pattern between the barrier layer 701 and the TSV contact pad 301.

Optionally, a seed layer (not shown) may be formed over the barrier layer 701. The seed layer is preferably deposited by CVD, and is preferably formed of copper, although other methods and materials may alternatively be used if desired. The seed layer, similar to the barrier layer 701, is preferably deposited conformally so as to maintain the zigzag shape of the surface to which it is deposited. This assures that the zigzag shape of the barrier layer 701 is retained in the seed layer.

Figure 8:
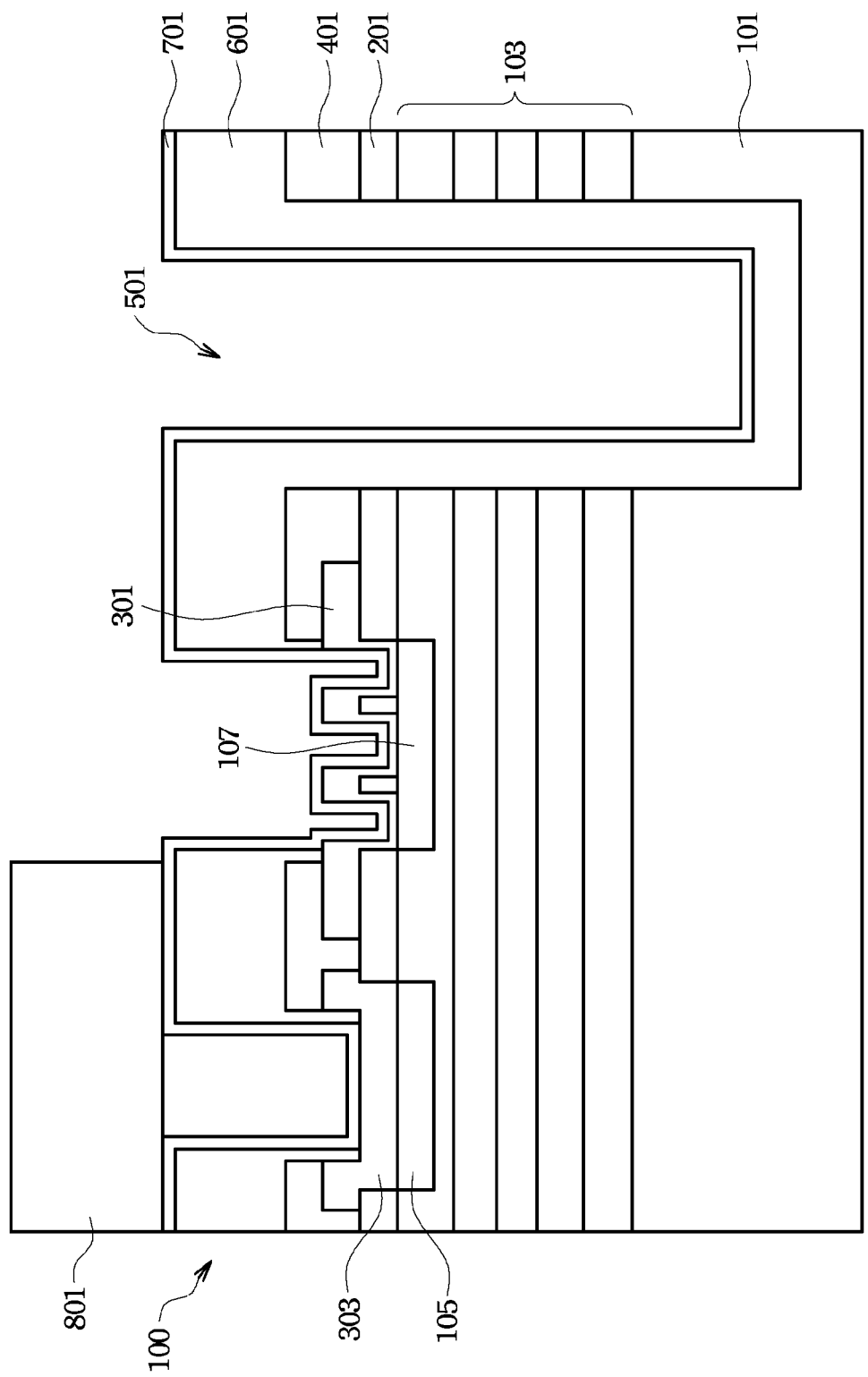
FIG. 8 illustrates the formation of a photomask over an exterior contact pad in accordance with an embodiment of the present invention.

FIG. 8 illustrates the formation and patterning of a second photoresist 801 over the barrier layer 701. The second photoresist 801 is preferably a dry film photoresist such as a photosensitive polyimide film, and is preferably formed by laminating the second photoresist 801 over the surface of the semiconductor die 100. The second photoresist 801 is preferably patterned so as to protect the exterior contact pad 303 from subsequent processing while leaving exposed the TSV contact pad 301, portions of the barrier layer 701 located over the TSV contact pad 301, and portions of the barrier layer 701 over the TSV opening 501.

Figure 9:
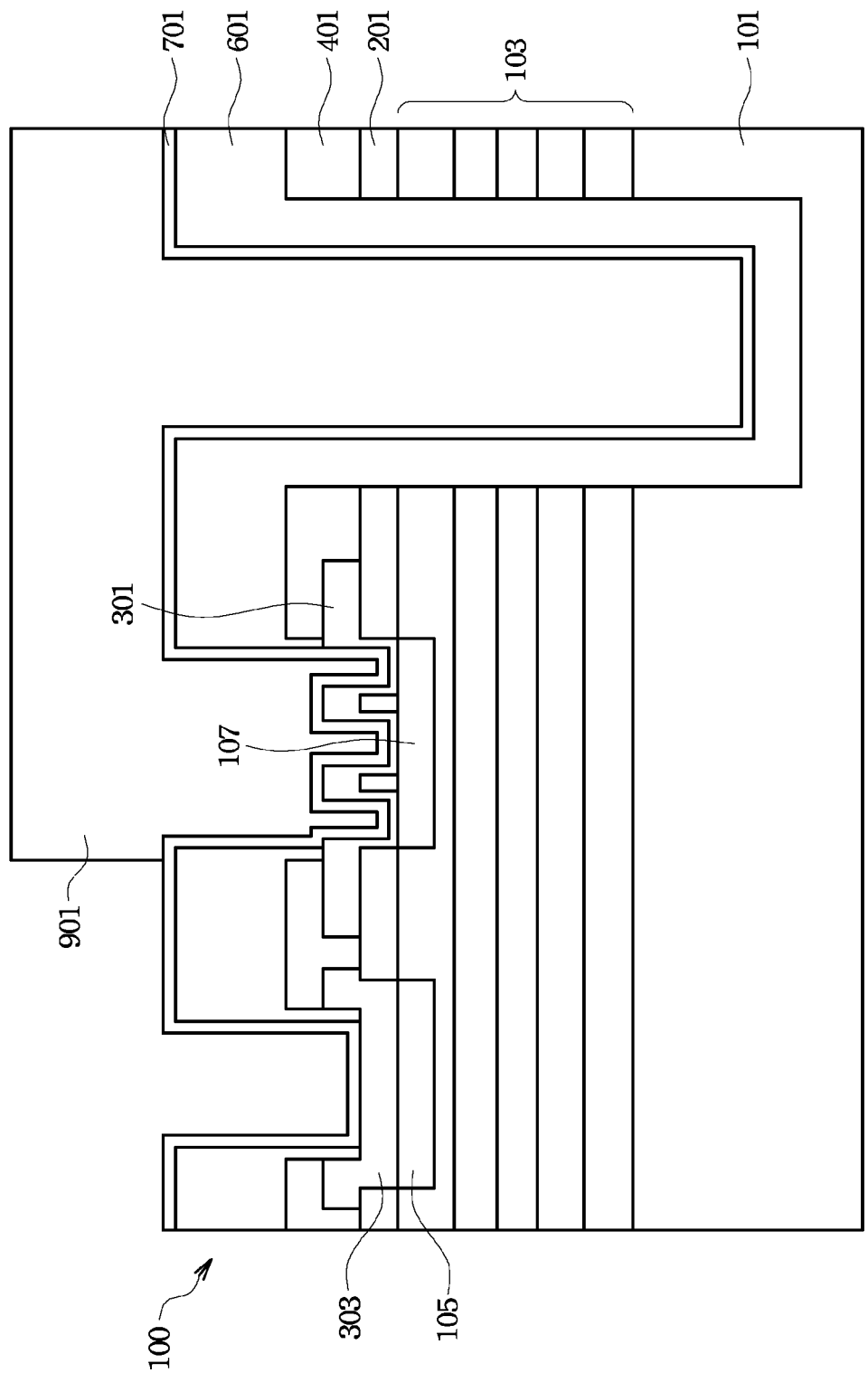
FIG. 9 illustrates the formation of an overfilled conductive material in a TSV opening and over a TSV contact pad.

FIG. 9 illustrates the plating of a conductive material 901 onto the barrier layer 701. Preferably, the conductive material 901 completely fills and overfills the openings to the TSV contact pad 301 and the TSV opening 501. Further, the conductive material 901 also forms on the surface of the barrier layer 701 outside of the openings so as to form a conductive path from the TSV opening 501 to the TSV contact pad 301.

The conductive material 901 is preferably formed through an electrodeposition process and preferably comprises copper. However, other suitable methods, such as electroless deposition, plating, or CVD, and other suitable materials, such as tungsten, may alternatively be used to form the conductive material. The conductive material 901 is initially formed to have a thickness over the barrier layer 701 of between about 10 µm and about 30 µm, with a preferred thickness of about 20 µm. Once the conductive material 901 has been formed, the second photoresist 801 is preferably removed by a suitable process such as stripping or ashing.

Figure 10:
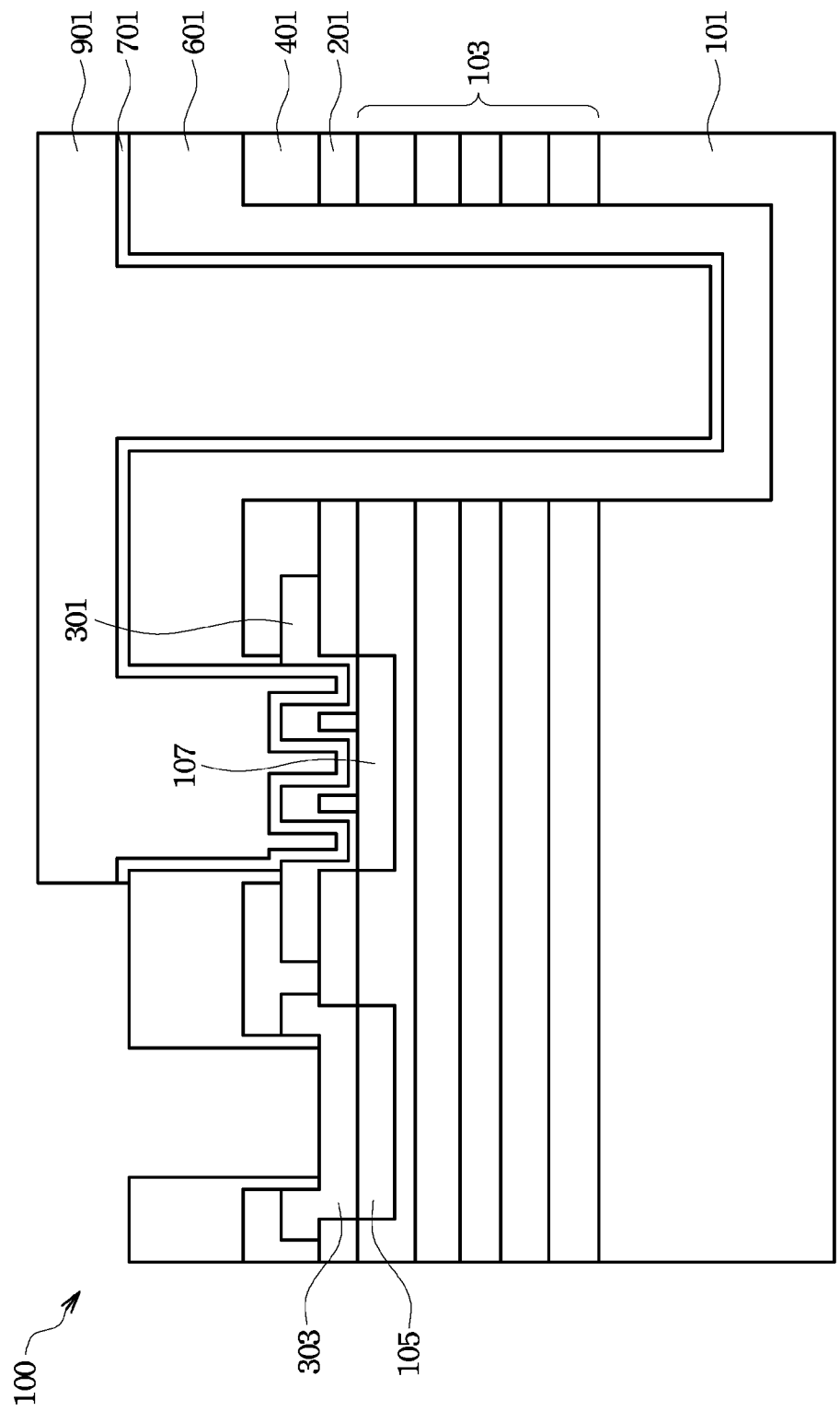
FIG. 10 illustrates the removal of a barrier layer over an exterior contact pad and the thinning of a conductive material over a TSV contact pad and through silicon via in accordance with an embodiment of the present invention.

FIG. 10 illustrates the removal of portions of the barrier layer 701 from those areas that had been protected by the second photoresist 801, and where the conductive material 901 had been prevented from being plated. The barrier layer 701 is preferably removed using an etchant such as $H_2SO_4$ and $H_2O_2$. However, other suitable methods to remove these layers may alternatively be utilized.

Figure 11:
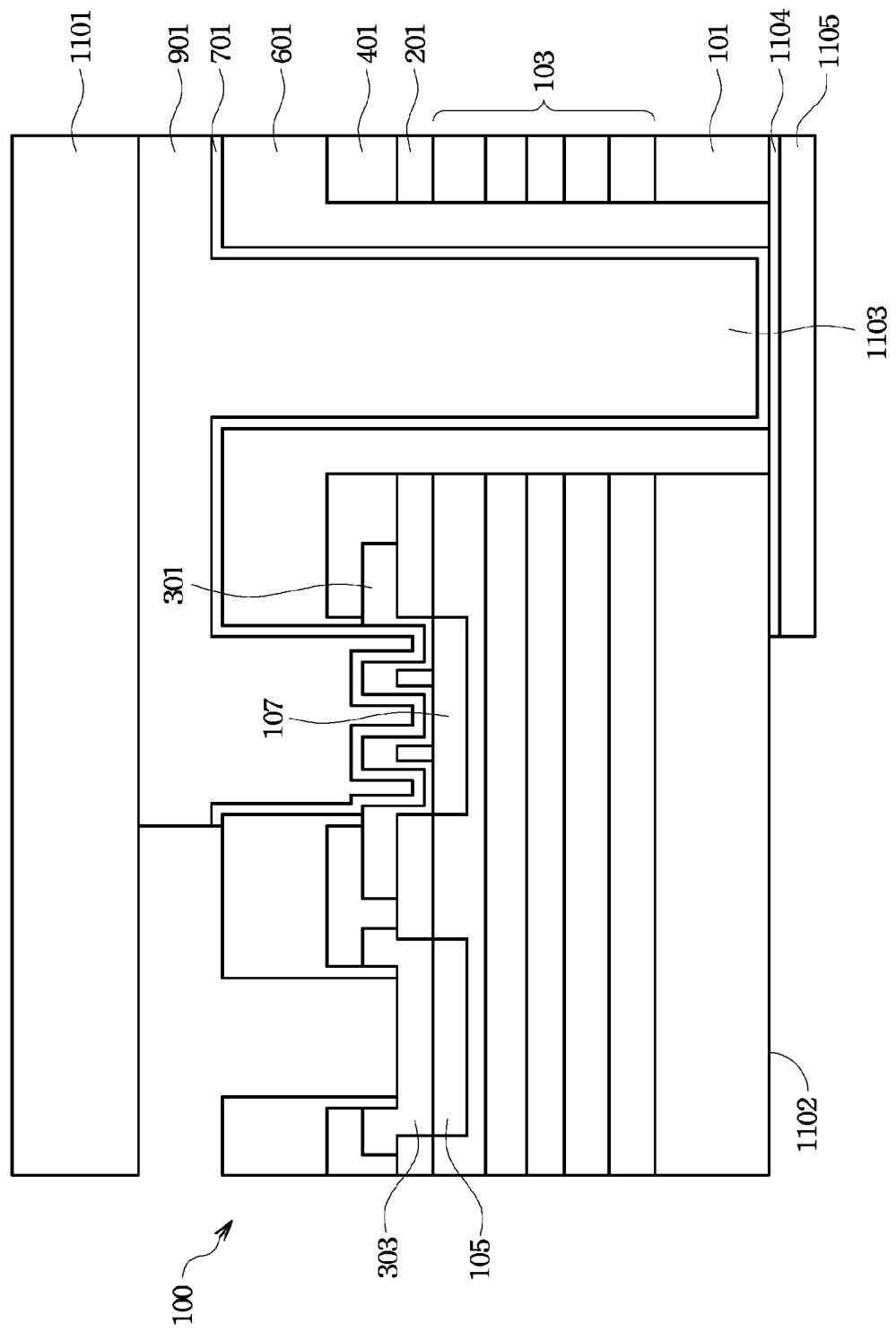
FIG. 11 illustrates the thinning of a die and the formation of a conductive layer and an ENIG layer over a second side of the die in accordance with an embodiment of the present invention.

FIG. 11 illustrates further steps in the formation of the TSV 1103. Preferably, a carrier 1101 is attached to a first surface of the semiconductor device 100. The carrier 1101 may comprise, for example, glass, silicon oxide, aluminum oxide, and the like. In an embodiment, a second adhesive (not shown) may be used to glue the carrier 1101 to a top surface of the semiconductor die 100. The second adhesive may be any suitable adhesive, such as an ultraviolet (UV) glue, which loses its adhesive property when exposed to UV lights. The preferred thickness of the carrier 1101 is preferably greater than about 12 mils.

Alternatively, the carrier 1101 may preferably comprise a suitable carrier tape. If a carrier tape is utilized, the carrier tape is preferably the commonly known blue tape. The carrier tape is preferably attached to the semiconductor die 100 using a second adhesive (not shown) located on the carrier tape.

Once attached to the carrier 1101, portions of a second side 1102 of the substrate 101 are then removed to expose the conductive material 901 located within the TSV opening 501 to complete the TSV 1103. The removal is preferably performed with a grinding process such as a chemical mechanical polish (CMP), although other suitable processes, such as etching, may alternatively be used. The removal process preferably removes between about 100 µm and about 190 µm, and more preferably removes about 175 µm of the substrate 101.

After the removal of a portion of the second side 1102 of the substrate 101, a second etch is preferably performed. This second etch is intended to clean and polish the substrate 101 after the CMP. Additionally, this second etch also helps release stresses that may have formed during the CMP process of grinding the substrate 101. The second etch preferably uses $HNO_3$, although other suitable etchants may alternatively be used.

Finally, after a cleaning process to remove any remaining polishing residue such as copper oxide, a conductive layer 1104 is preferably formed on the second side 1102 of the substrate 101 in electrical contact with the conductive material 901 located within the TSV 1103. The conductive layer 1104 preferably comprises aluminum, and is preferably formed through a sputter deposition process. However, other materials, such as nickel or copper, and other formation processes, such as electroplating or electroless plating, may alternatively be used. The conductive layer 1104 is preferably formed with a thickness of between about 1 µm and about 3 µm, with a preferred thickness of about 2 µm.

The formation of the conductive layer 1104 is preferably followed by an Electroless Nickel Gold (ENIG) process to form an ENIG layer 1105 opposite the conductive layer 1104 from the substrate 101. The ENIG process provides for a flat, uniform metal surface finish for the formation of contacts from the die 100 to other devices (not shown). The ENIG process preferably comprises cleaning the conductive layer 1104, immersing the substrate 101 in a zincate activation solution, electrolessly plating nickel onto the conductive layer 1104, and electrolessly plating gold onto the nickel. The ENIG layer 1105 is preferably formed to a thickness of between about 2 µm and about 4 µm, with a preferred thickness of about 3 µm. Once formed, the conductive layer 1104 and the ENIG layer 1105 are preferably patterned by a suitable photolithographic process and unwanted material is removed through a suitable etching process.

Although the present invention and its advantages have been described in detail, it should be understood that various changes, substitutions and alterations can be made herein without departing from the spirit and scope of the invention as defined by the appended claims. For example, many processes may be used to form the TSV. As another example, it will be readily understood by those skilled in the art that materials and processes of formation may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a substrate with a first conductive feature;
    a passivation layer over the first conductive feature;
    a first contact pad extending through multiple openings in the passivation layer to make multiple discontinuous contacts with the first conductive feature, wherein the first contact pad extends no further than the passivation layer and wherein the first contact pad has a non-planar first surface located on an opposite side of the first contact pad than the substrate; and
    a through substrate via with a continuous composition, wherein a portion of the through substrate via extends over and is in contact with the first surface of the first contact pad.

2. The semiconductor device of claim 1, wherein the discontinuous contacts are discontinuous in a first direction and continuous in a second direction substantially perpendicular to the first direction.

3. The semiconductor device of claim 1, wherein the discontinuous contacts are discontinuous in a first direction and a second direction, the second direction being substantially perpendicular to the first direction.

4. The semiconductor device of claim 3, wherein the discontinuous contacts form a grid pattern.

5. The semiconductor device of claim 1, further comprising a second conductive feature over the first contact pad.

6. The semiconductor device of claim 1, further comprising:
    a second conductive feature located below the passivation layer; and
    a second contact pad that extends through the passivation layer and has a substantially planar interface with the second conductive feature.

7. The semiconductor device of claim 1, wherein the through substrate via is a through silicon via.

8. The semiconductor device of claim 7, wherein the first contact pad is located on a first side of the substrate, and the through substrate via contacts a conductor on a second side of the substrate opposite the first side.

9. A semiconductor device comprising:
    a semiconductor substrate;

metal layers over the semiconductor substrate;

a passivation layer over the metal layers, the passivation layer having a first maximum thickness perpendicular to the semiconductor substrate;

a first conductor extending through multiple openings in the passivation layer and sharing an interface with an uppermost metal layer, wherein, in a first direction, the first conductor alternates between contacting the uppermost metal layer and the passivation layer, the multiple openings having a second thickness at least as great as the first maximum thickness of the passivation layer, and wherein the interface between the first conductor and the uppermost metal layer is planar, the first conductor being conformal and being a contact pad located in an exterior region of the semiconductor device; and a through substrate via through the semiconductor substrate, the through substrate via having a continuous composition and wherein a portion of the through substrate via extends over and is in contact with the contact pad.

10. The semiconductor device of claim 9, wherein, in a second direction substantially perpendicular with the first direction, the interface is substantially continuous.

11. The semiconductor device of claim 9, wherein, in a second direction substantially perpendicular with the first direction, the first conductor alternates between contacting the uppermost metal layer and the passivation layer.

12. The semiconductor device of claim 11, wherein the interface forms a substantially symmetrical grid pattern of contacts.

13. The semiconductor device of claim 9, further comprising a second conductor different from the first conductor, the second conductor having a substantially planar interface between the second conductor and a portion of the uppermost metal layer.

14. A semiconductor device comprising:

a semiconductor substrate comprising a first metal layer;

a passivation layer over portions of the first metal layer;

a first conductive layer shaped in a zigzag pattern with a plurality of extensions through the passivation layer to make a plurality of contact points with the first metal layer, the first conductive layer being a contact pad and being in contact with between about 30% and about 70% of the first metal layer, wherein the extensions extend no further than a bottom surface of the passivation layer, wherein the contact pad is adjacent to an external passivation layer of the semiconductor device and wherein at least a portion of an upper surface of the contact pad extends below the passivation layer; and a second conductive layer filling the zigzag pattern and extending above an upper-most portion of the first conductive layer, the second conductive layer having a continuous composition and extending through the semiconductor substrate.

15. The semiconductor device of claim 14, wherein the passivation layer forms a series of substantially parallel lines in a first direction between the first metal layer and the first conductive layer.

16. The semiconductor device of claim 14, wherein the passivation layer forms a grid pattern between the first metal layer and the first conductive layer.

17. The semiconductor device of claim 14, further comprising:

a second metal layer located beneath the passivation layer;

a second conductive layer comprising a substantially planar interface with the second metal layer that is substantially parallel with a major surface of the semiconductor substrate.

18. The semiconductor device of claim 14, wherein the first conductive layer is electrically connected to a third conductive layer on an opposite side of the semiconductor substrate than the first conductive layer.

* * * * *

UNITED STATES PATENT AND TRADEMARK OFFICE
CERTIFICATE OF CORRECTION

Page 1 of 1

PATENT NO. : 8,653,648 B2
APPLICATION NO. : 12/245505
DATED : February 18, 2014
INVENTOR(S) : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 557 days.

Signed and Sealed this
Twentieth Day of October, 2015

Michelle K. Lee
*Director of the United States Patent and Trademark Office*